United States Patent
Ishida et al.

(10) Patent No.: US 7,136,773 B2
(45) Date of Patent: Nov. 14, 2006

(54) TESTING APPARATUS AND TESTING METHOD

(75) Inventors: Masahiro Ishida, Tokyo (JP); Takahiro Yamaguchi, Tokyo (JP); Mani Soma, Seattle, WA (US)

(73) Assignee: Advantest Corporation, Tokyo (JP)

( * ) Notice: Subject to any disclaimer, the term of this patent is extended or adjusted under 35 U.S.C. 154(b) by 173 days.

(21) Appl. No.: 10/737,716

(22) Filed: Dec. 16, 2003

(65) Prior Publication Data

US 2005/0149784 A1    Jul. 7, 2005

(51) Int. Cl.
*G01R 31/00* (2006.01)

(52) U.S. Cl. ........................ 702/120; 375/226
(58) Field of Classification Search ............ 702/58–59, 702/69, 71, 74, 81–84, 118, 120, 182–185, 702/190; 375/224, 226; 324/73.1, 763, 324/520–521
See application file for complete search history.

(56) References Cited

U.S. PATENT DOCUMENTS

| | | | | |
|---|---|---|---|---|
| 4,654,861 A | * | 3/1987 | Godard | 375/226 |
| 4,825,379 A | * | 4/1989 | Luthra et al. | 702/71 |
| 5,710,517 A | * | 1/1998 | Meyer | 327/163 |
| 5,793,822 A | * | 8/1998 | Anderson et al. | 375/371 |
| 6,246,717 B1 | * | 6/2001 | Chen et al. | 375/226 |
| 6,356,850 B1 | * | 3/2002 | Wilstrup et al. | 702/69 |
| 2002/0174159 A1 | | 11/2002 | Laquai | 708/819 |

* cited by examiner

Primary Examiner—Marc S. Hoff
Assistant Examiner—Mary Catherine Baran
(74) Attorney, Agent, or Firm—Osha Liang LLP

(57) ABSTRACT

A testing apparatus for testing an electronic device, includes a deterministic jitter applying means for applying deterministic jitter to a given input signal without any amplitude variation component occurring and supplying the input signal applied with the deterministic jitter to the electronic device, a jitter amount controlling means for controlling magnitude of the deterministic jitter to be applied by the deterministic jitter applying means and a judging means for judging quality of the electronic device based on an output signal outputted by the electronic device in response to the input signal.

10 Claims, 9 Drawing Sheets

TESTING APPARATUS AND TESTING METHOD

FIELD OF THE INVENTION

The present invention relates to an apparatus and a method for testing an electronic device. More particularly, the present invention relates to an apparatus and a method for testing an electronic device by supplying an input signal applied with jitter to the electronic device.

BACKGROUND OF THE INVENTION

A jitter test is one of many very important tests with regard to a serial communication device or serial I/O device. For example, the recommendation of International Telecommunication Union, Bellcore or the like specifies the measurement of jitter tolerance, jitter generation, and jitter transfer function. Particularly, the jitter tolerance test is important because this test makes it possible to evaluate the behavior limit of a device to the jitter added to a transmission medium. The measurement of jitter tolerance is to measure the magnitude of the jitter applied to an input signal, by which a bit error begins to occur in a device, with the magnitude of the applied jitter being changed.

FIG. 1 shows a conventional measurement of jitter tolerance. In the conventional measurement of jitter tolerance, random jitter is applied to an input signal shown in FIG. 1A by overlapping white noise shown in FIG. 1B and the input signal. FIG. 1C shows the input signal to which the random jitter applied. Then, the input signal, to which the random jitter applied, is supplied to an electronic device so that whether or not a bit error occurs in the electronic device is measured.

FIG. 2 shows a configuration of a conventional apparatus 200 for applying jitter to an input signal. The input signal generated by a pattern generator 202 is applied with sinusoidal jitter by a sinusoidal jitter source 206, and further applied with deterministic jitter and random jitter by a deterministic jitter source 208 and a random jitter source. The jitter amount to be applied to the input signal is adjusted according to the magnitudes of the random jitter and the sinusoidal jitter. Then, the input signal is amplified by a limiting amplifier 214, and is outputted after the amplitude components of the input signal, which are more than or equal to a predetermined value or less than or equal to another predetermined value, are clipped.

FIG. 3 shows behavior of the limiting amplifier 214. The limiting amplifier 214 is given the input signal shown in FIG. 3A. The input signal has amplitude variation components because it is applied with the random jitter.

Although the limiting amplifier 214 reduces the amplitude variation components by eliminating the amplitude components more than or equal to a first threshold and the amplitude components less than or equal to a second threshold among the amplitude components of the input signal as shown in FIG. 3B, the amplitude variation components that are within a range less than the first threshold and more than the second threshold cannot be eliminated. In order to measure the jitter tolerance of an electronic device, it is necessary to supply an input signal without any amplitude variation component like the input signal shown in FIG. 3C to the electronic device and detect a bit error caused by only the jitter components in the amplitude direction. However, the bit error caused by the amplitude variation components is bound to be detected in the conventional apparatus 200 because the amplitude variation components remain in the input signal as shown in FIG. 3B. Accordingly, the jitter tolerance of the electronic device is evaluated too small. In addition, since the conventional apparatus 200 for applying jitter has the three jitter sources, i.e., the sinusoidal jitter source 206, the deterministic jitter source 208, and the random jitter source 212, the manufacture cost is large.

Therefore, it is an object of the present invention to provide a testing apparatus and a testing method, which is capable of overcoming the above drawbacks accompanying the conventional art. The above and other objects can be achieved by combinations described in the independent claims. The dependent claims define further advantageous and exemplary combinations of the present invention.

DESCRIPTION OF THE INVENTION

According to the first aspect of the present invention, a testing apparatus for testing an electronic device, includes a deterministic jitter applying means for applying deterministic jitter to a given input signal without any amplitude variation component occurring and supplying the input signal applied with the deterministic jitter to the electronic device, a jitter amount controlling means for controlling the magnitude of the deterministic jitter to be applied by the deterministic jitter applying means and a judging means for judging quality of the electronic device based on an output signal outputted by the electronic device in response to the input signal.

The deterministic jitter applying means may include a first-order filter which applies the deterministic jitter as the input signal passes through the first-order filter.

The deterministic jitter applying means may include a cable which applies the deterministic jitter as the input signal passes through the cable.

The testing apparatus may further include a sinusoidal jitter applying means for applying sinusoidal jitter to the input signal.

The sinusoidal jitter applying means may apply the sinusoidal jitter of a plurality of frequency components to the input signal.

According to the second aspect of the present invention, a testing method for testing an electronic device, includes a deterministic jitter application step of applying deterministic jitter to a given input signal without any amplitude variation component occurring and supplying the input signal applied with the deterministic jitter to the electronic device, a jitter amount control step of controlling the magnitude of the deterministic jitter to be applied in the deterministic jitter application step and a judgment step of judging quality of the electronic device based on an output signal outputted by the electronic device in response to the input signal.

The deterministic jitter may be applied by using a first-order filter through which the input signal passes in the deterministic jitter application step.

The deterministic jitter may be applied by using a cable through which the input signal passes in the deterministic jitter application step.

The testing method may further include a sinusoidal jitter application step of applying sinusoidal jitter to the input signal.

The sinusoidal jitter of a plurality of frequency components may be applied in the sinusoidal jitter application step.

The summary of the invention does not necessarily describe all necessary features of the present invention. The present invention may also be a sub-combination of the features described above. The above and other features and advantages of the present invention will become more apparent from the following description of the embodiments taken in conjunction with the accompanying drawings.

BRIEF DESCRIPTION OF THE DRAWINGS

FIG. 3 shows the behavior of a limiting amplifier 214.

FIG. 5 shows an example of the step responses of a filter.

THE BEST MODE FOR PRACTICING THE INVENTION

The invention will now be described based on the preferred embodiments, which do not intend to limit the scope of the present invention, but exemplify the invention. All of the features and the combinations thereof described in the embodiment are not necessarily essential to the invention.

Figure 4:
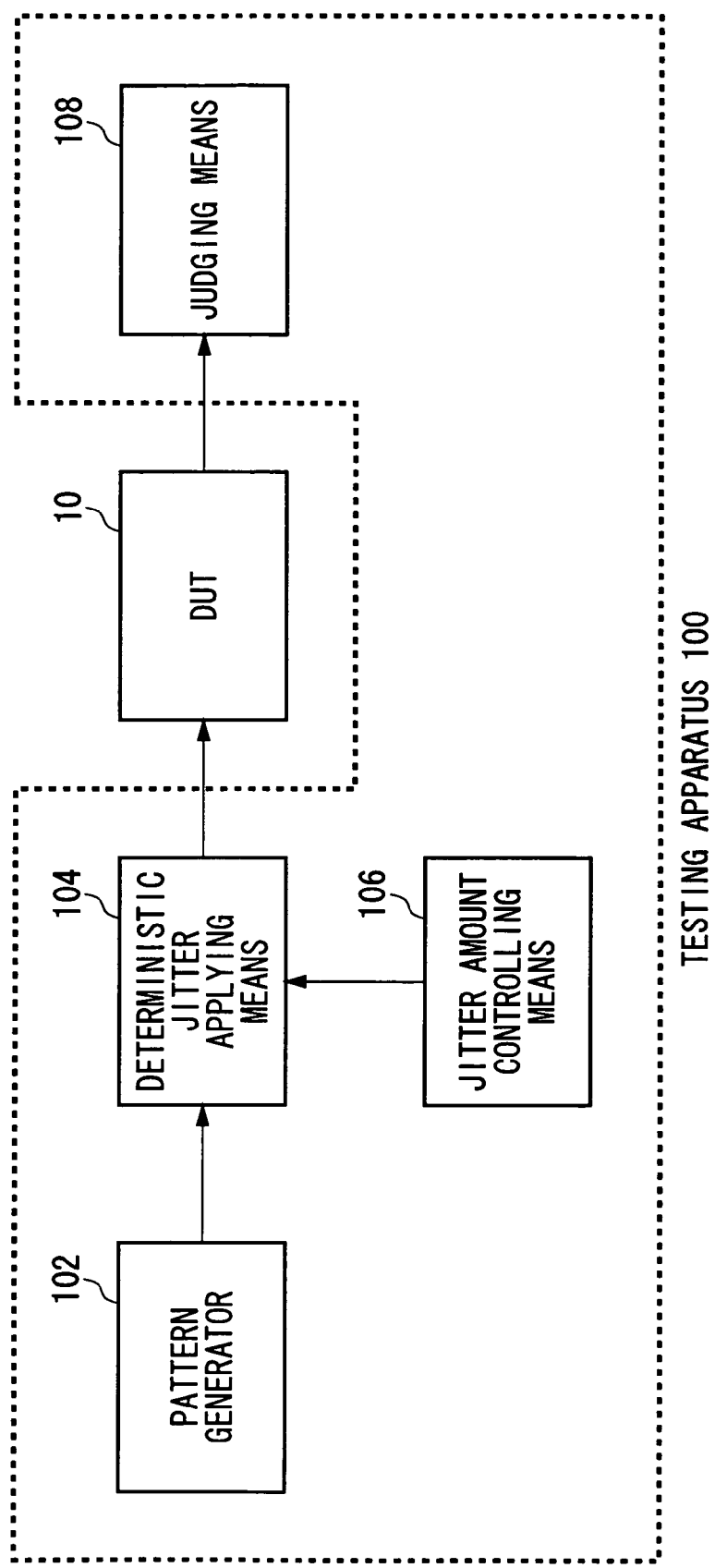
FIG. 4 shows an example of the configuration of a testing apparatus 100 according to an exemplary embodiment of the present invention.

FIG. 4 shows an example of a configuration of a testing apparatus 100 according to an exemplary embodiment of the present invention. The testing apparatus 100, which is an apparatus for testing the jitter tolerance of an electronic device 10, includes a pattern generator 102, a deterministic jitter applying means 104, a jitter amount controlling means 106, and a judging means 108. The electronic device 10 is, e.g., a serial communication device or serial I/O device. In addition, the electronic device 10 is not limited to this device. For example, it may be an electric circuit or a system including an electric circuit.

The pattern generator 102 generates an input signal to be supplied to the electronic device 10. The deterministic jitter applying means 104 receives the input signal generated by the pattern generator 102 and applies deterministic jitter to the input signal without any amplitude variation component occurring in the input signal. The deterministic jitter is, e.g., dependent on a signal pattern of the input signal.

For example, the deterministic jitter applying means 104 may be a first-order filter that applies the deterministic jitter to the input signal as the input signal passes through it. The first-order filter is, e.g., an RC filter. In this case, it is preferable that the resistance component and the capacitance component of the first-order filter can be changed.

In addition, the deterministic jitter applying means 104 may include a cable that applies the deterministic jitter as the input signal passes through it. In this case, the deterministic jitter applying means 104 preferably includes a plurality of cables, provided in parallel, the lengths of which are different from one another.

The jitter amount controlling means 106 controls the magnitude of the deterministic jitter to be applied by the deterministic jitter applying means 104. For example, if the deterministic jitter applying means 104 applies the deterministic jitter by using the first-order filter, the jitter amount controlling means 106 controls the magnitude of the deterministic jitter to be applied by controlling the magnitudes of the resistance component and the capacitance component of the first-order filter.

In addition, if the deterministic jitter applying means 104 has a plurality of cables, the jitter amount controlling means 106 controls the magnitude of the deterministic jitter to be applied by determining which of the cables the input signal passes through.

The judging means 108 detects a bit error of the output signal in response to the input signal. The judging means 108 detects the bit error of the output signal by receiving an expected value to be compared with the output signal from the pattern generator 102 and comparing the output signal and the expected value. By performing the detection of the bit error as above for each magnitude of the applied deterministic jitter, the jitter tolerance of the electronic device 10 can be measured. In other words, the jitter amount controlling means 106 changes the magnitude of the deterministic jitter gradually, and then the judging means 108 detects the bit error of the output signal for each magnitude of the deterministic jitter changed by the jitter amount controlling means 106. Then, by comparing the specification value of the jitter tolerance of the electronic device 10 with the measured jitter tolerance, the quality of the electronic device 10 can be judged.

In addition, the testing apparatus 100 may perform the measurement only near the specification value of the jitter tolerance of the electronic device 10.

Figure 5A:
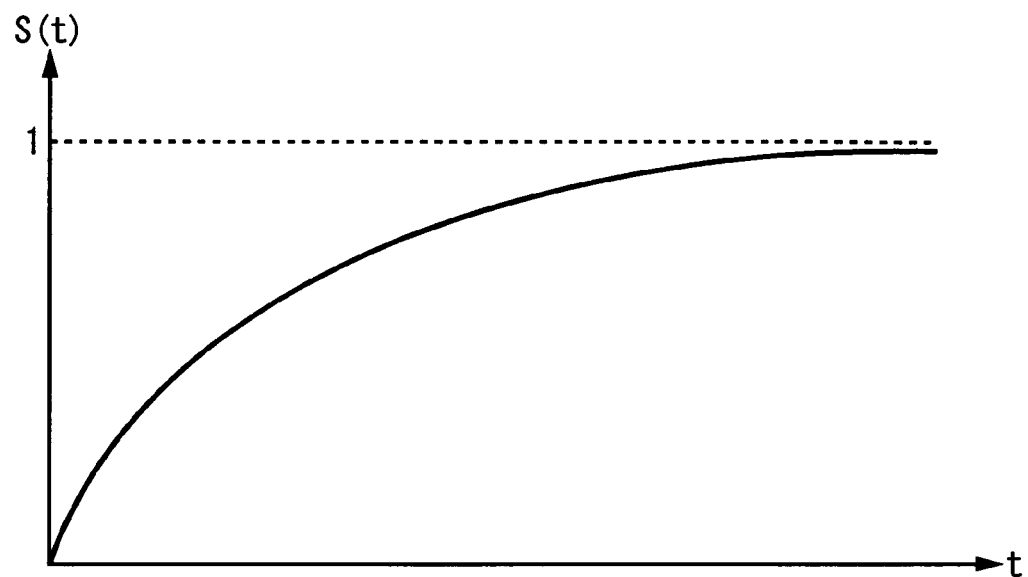
FIG. 5A shows the step response of a first-order filter and FIG. 5B shows the step response of a second-order filter.
Figure 5B:
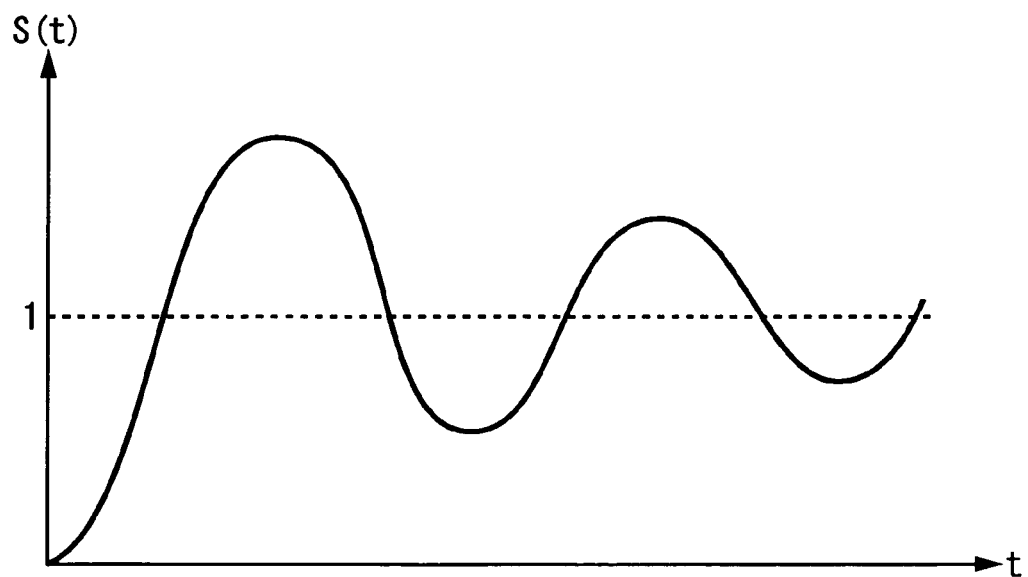

FIG. 5 shows an example of a step response of a filter. FIG. 5A shows a step response of a first-order filter and FIG. 5B shows a step response of a second-order filter. If the deterministic jitter applying means 104 applies the deterministic jitter by using a first-order filter, the step response of the first-order filter is shown as FIG. 5A. Since the step response of the first-order filter as shown in FIG. 5A has smoothly increasing characteristics, the amplitude variation as described in relation to FIG. 3 does not occur. Accordingly, if the deterministic jitter is applied by using a first-order filter, it is possible to detect the bit error caused by only the jitter without detecting the bit error caused by the amplitude variation.

Figure 1A:
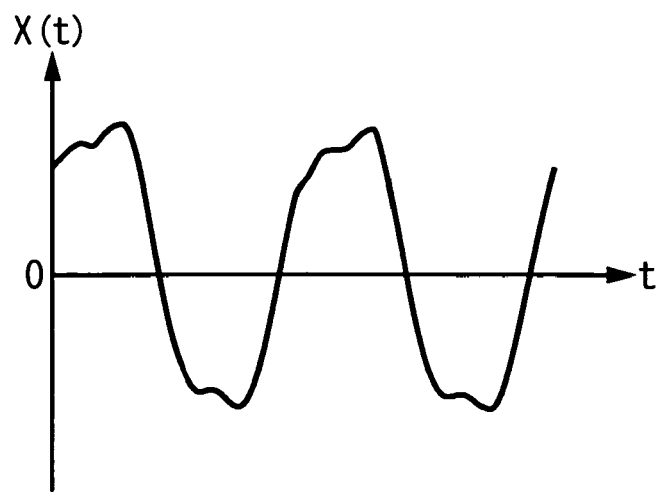
FIG. 1 shows the conventional measurement of jitter tolerance.
Figure 1B:
Figure 1C:
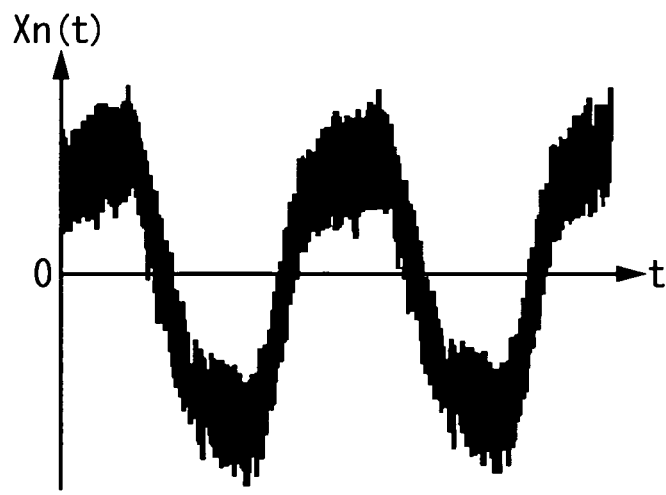
Figure 2:
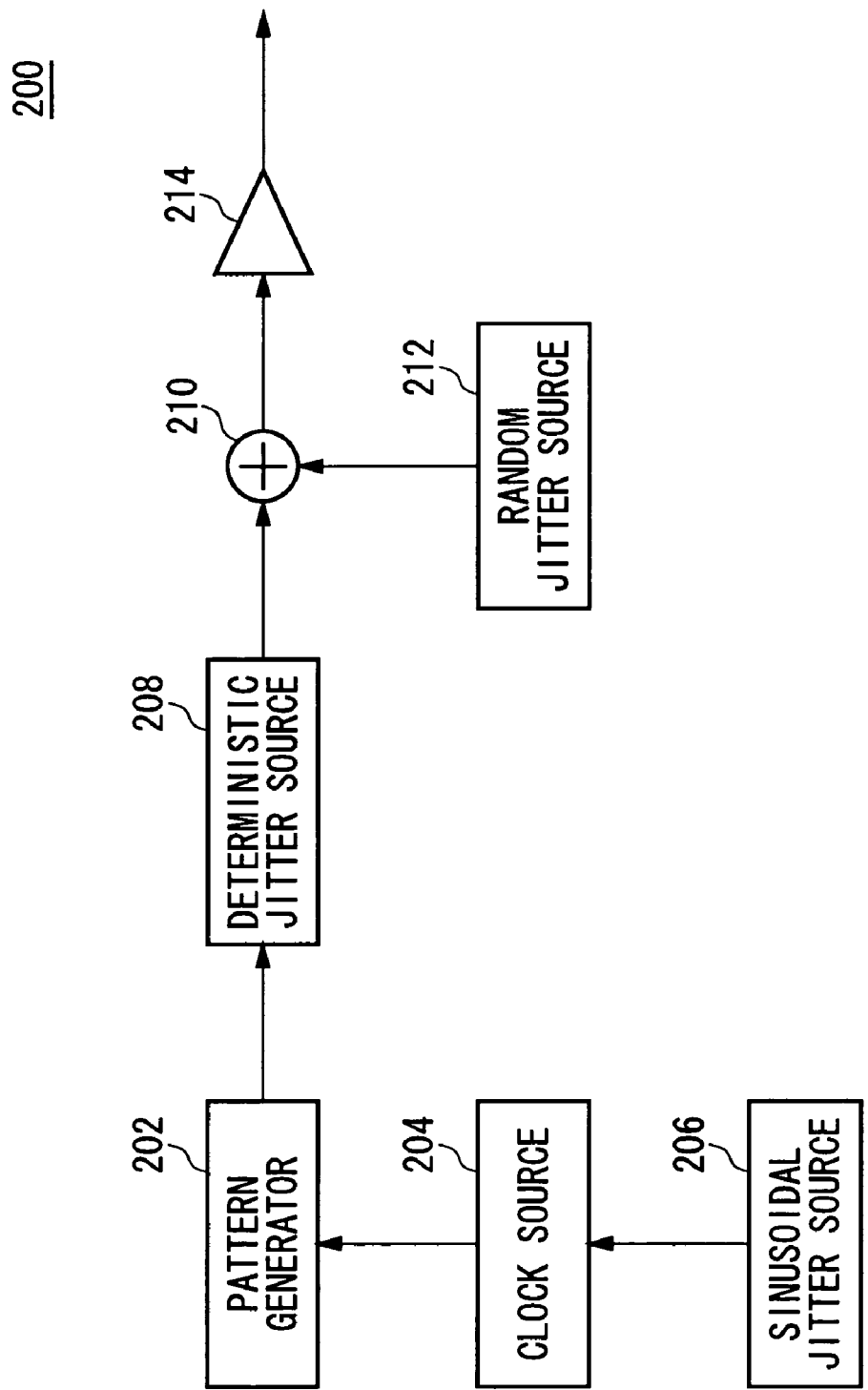
FIG. 2 shows the configuration of a conventional apparatus 200 for applying jitter to an input signal.
Figure 3A:
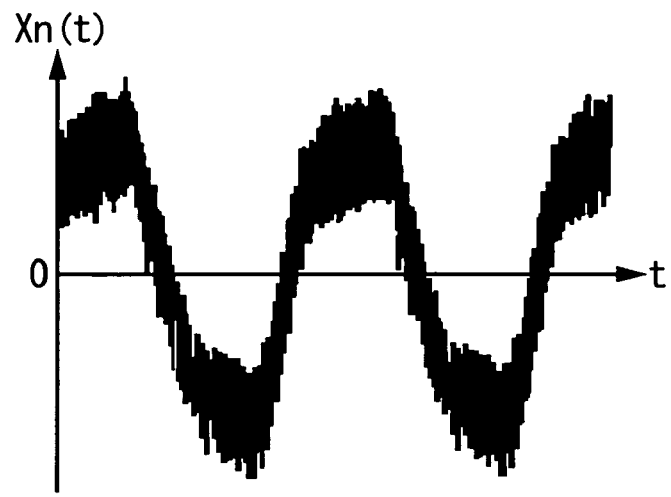
FIG. 3A shows an input signal.
Figure 3B:
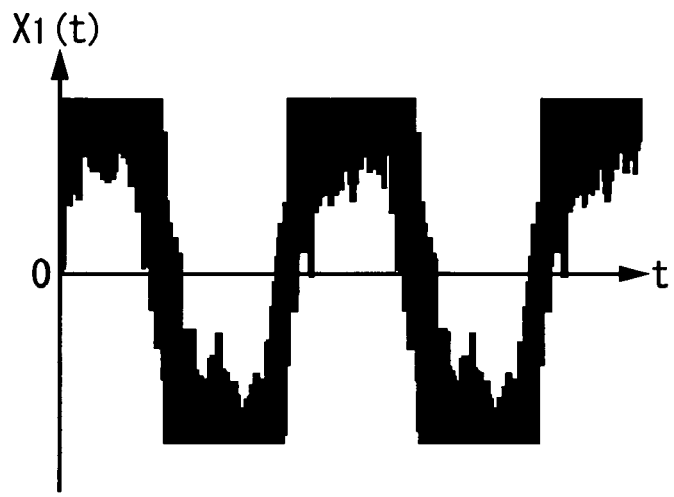
FIG. 3B shows a signal outputted by a limiting amplifier 214 and FIG. 3C shows an input signal without any amplitude variation component.
Figure 3C:
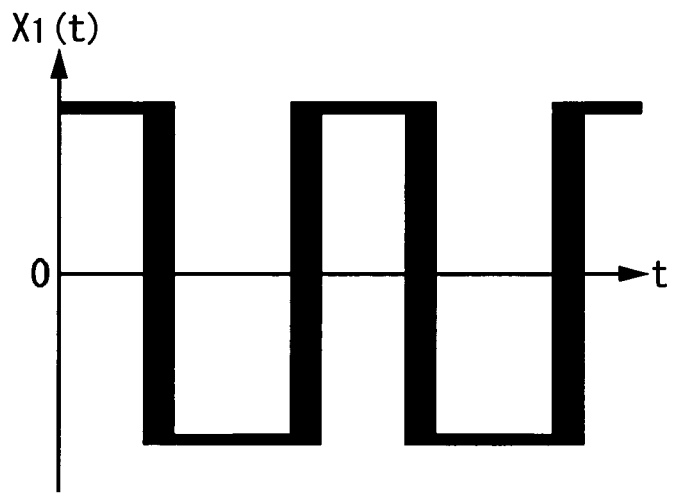

In contrast, if the deterministic jitter is applied to the input signal by using a second-order filter, the amplitude variation as shown in FIG. 3 may occur because the step response of the second-order filter is as shown in FIG. 5B. Therefore, the bit error caused by the amplitude variation is detected so that the jitter tolerance of the electronic device 10 might not be measured with high precision. The testing apparatus 100 according to the present invention applies the deterministic jitter by using a first-order filter so that it can detect the jitter tolerance of the electronic device 10 with high precision.

In addition, in case of testing the jitter tolerance out of a loop bandwidth of a clock recovery circuit such as a PLL circuit included in the electronic device 10, it is necessary to apply the jitter having the frequency components of higher cutoff frequency than that of the loop filter of the clock recovery circuit to the input signal. For example, although the cutoff frequency of a loop filter used in a clock recovery circuit of a communication device of 2.5 Gbps is more than or equal to 1 MHz, using a cable makes it possible to apply jitter having the frequency components of cutoff frequency enough higher than that.

Figure 6:
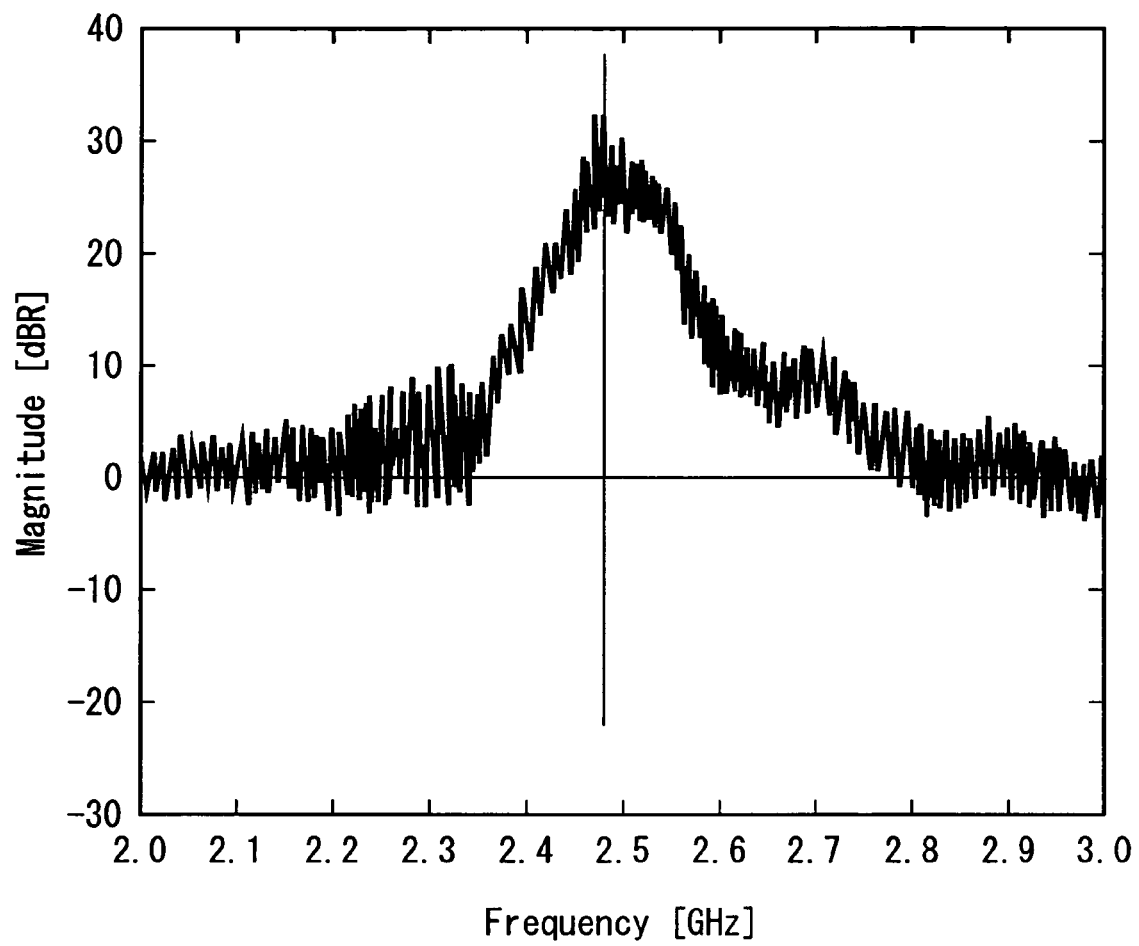
FIG. 6 shows an example of the spectrum of an input signal transmitted through a cable.

FIG. 6 shows an example of the sideband spectrum of an input signal transmitted through a cable. In the present embodiment, the carrier frequency of the input signal is 2.5 Gbps, and the cable is 20 meters long. As shown in FIG. 6, by performing transmission through the cable, a broad sideband of approximately 200 MHz per one side occurs near the carrier frequency in the spectrum of the input signal.

In other words, the deterministic jitter applied to the input signal has the frequency components of approximately 200 MHz so that it has the frequency components of cutoff frequency enough higher than that of the loop filter.

Figure 7:
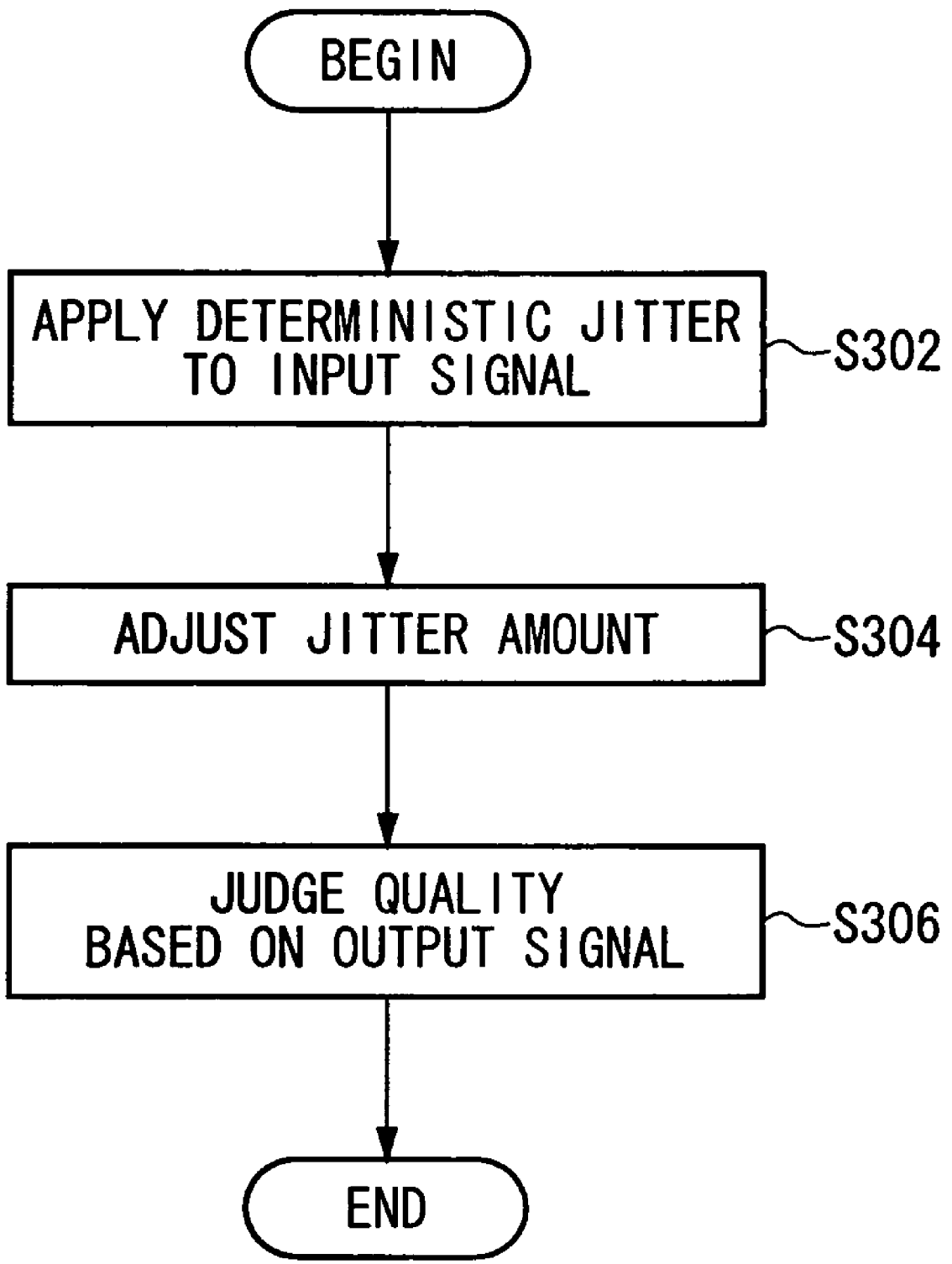
FIG. 7 is a flowchart showing an example of a method for testing an electronic device 10.

FIG. 7 is a flowchart showing an example of a method for testing the electronic device 10. The testing method may be performed using the testing apparatus 100 as shown in relation to FIG. 4.

First, in a deterministic jitter application step S302, the deterministic jitter is applied to the input signal. In S302, the deterministic jitter is applied to the input signal using the deterministic jitter applying means 104 without any amplitude variation component occurring. At this time, the magnitude of the deterministic jitter to be applied is controlled by the jitter amount controlling means 106 in a jitter amount control step S304. Then, in a judgment step S306, the electronic device 10 judges the quality of the electronic device 10 based on the output signal in response to the input signal.

Figure 8:
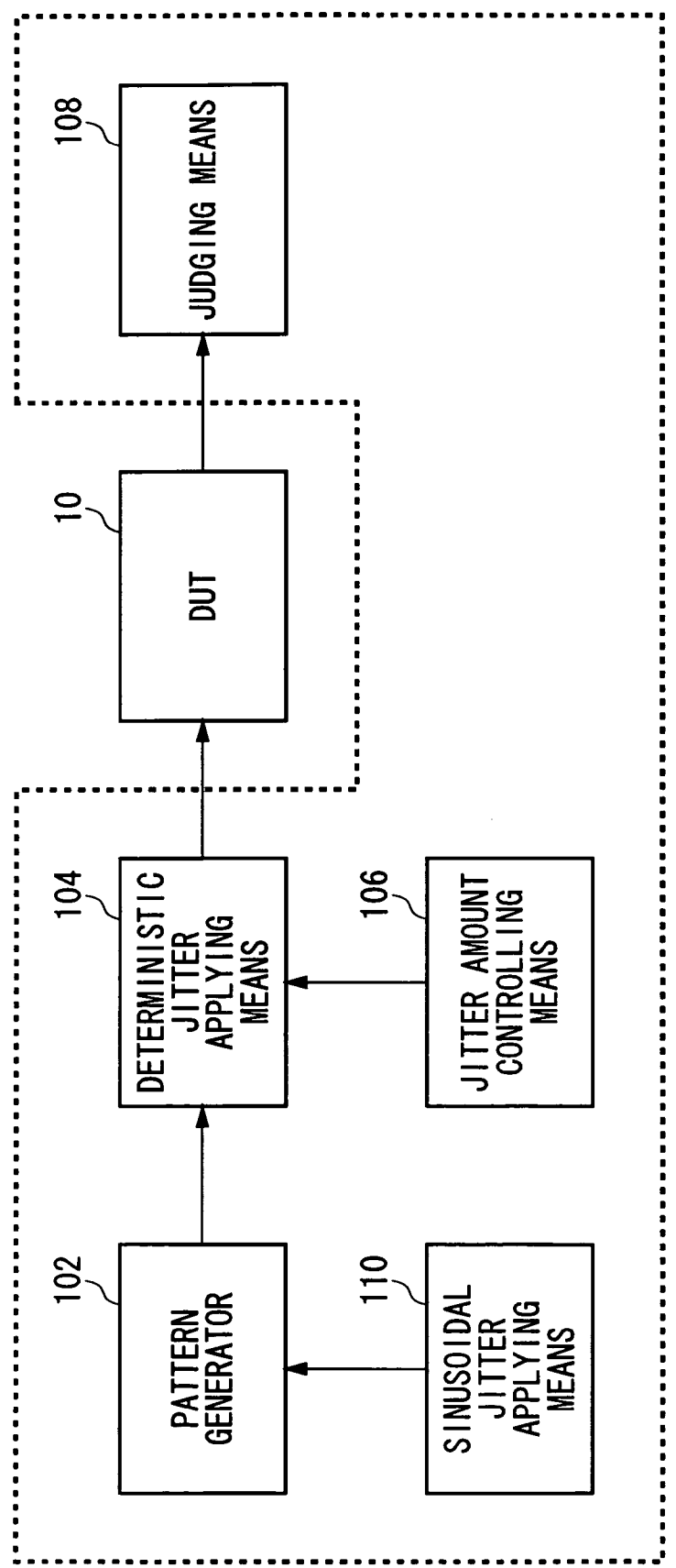
FIG. 8 shows another example of the configuration of a testing apparatus 100.

FIG. 8 shows another example of the configuration of the testing apparatus 100. The testing apparatus 100 according to the present example further include a sinusoidal jitter applying means 110 in addition to the testing apparatus 100 as described in relation to FIG. 4. The elements in FIG. 8 given the same references as those in FIG. 4 have the same configuration and function as those of the elements described in relation to FIG. 4.

The sinusoidal jitter applying means 110 applies the sinusoidal jitter to the input signal generated by the pattern generator 102. For example, the sinusoidal jitter applying means 110 applies the sinusoidal jitter by performing the phase variation of the clock used for generating the input signal by the pattern generator 102 using a sine wave. The sinusoidal jitter applying means 110 may apply the sinusoidal jitter of a single frequency component or may apply the sinusoidal jitter a plurality of frequency components.

According to the testing apparatus 100 of the present invention, it is possible to apply the jitter of predetermined magnitude to the input signal.

Figure 9:
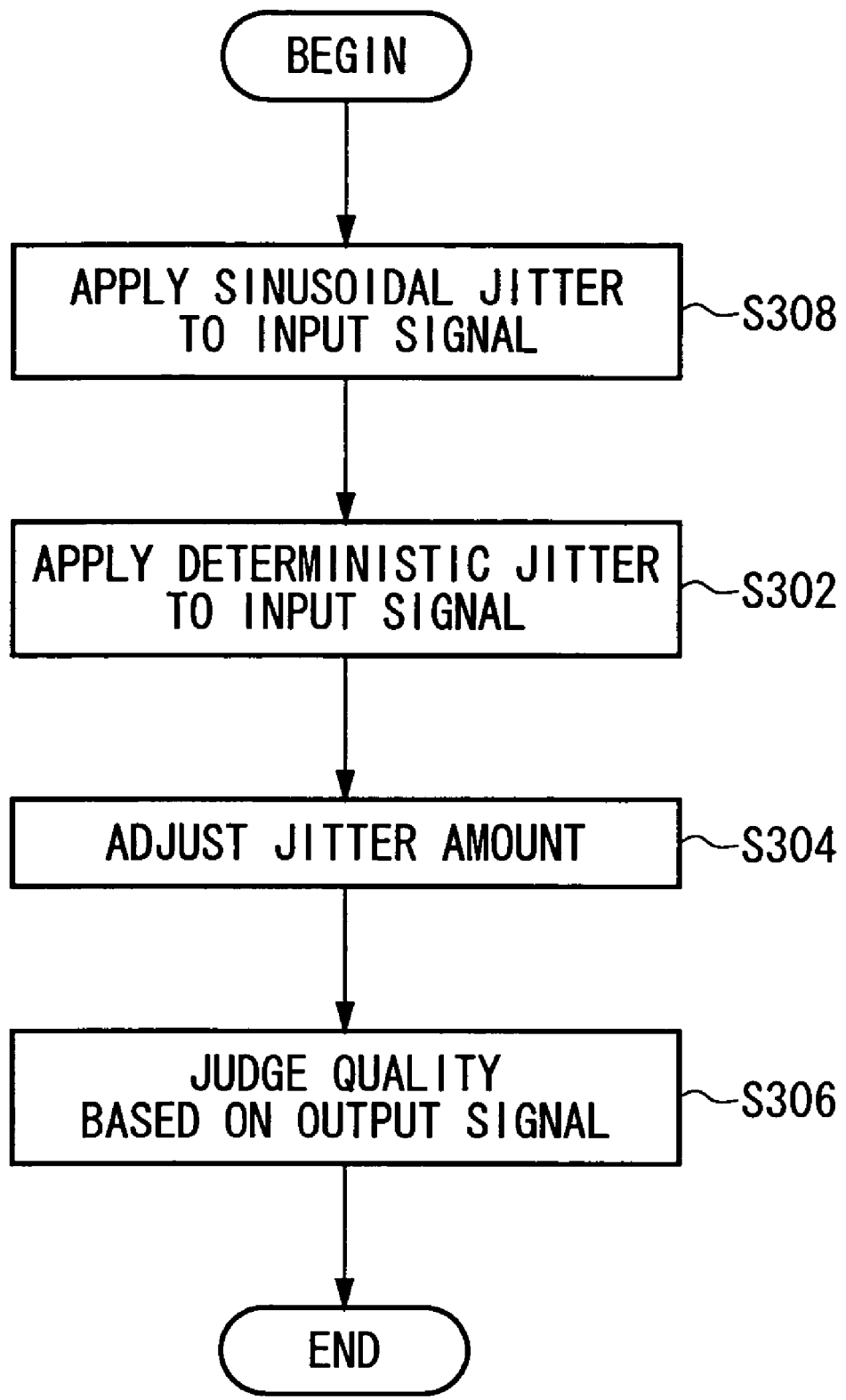
FIG. 9 is a flowchart showing another example of a method for testing an electronic device 10.

FIG. 9 is a flowchart showing another example of a method for testing the electronic device 10. The testing method of the present example further includes a sinusoidal jitter application step S308 to the testing method as described in FIG. 7. In the sinusoidal jitter application step S308, the sinusoidal jitter is applied to the input signal using the sinusoidal jitter applying means 110 as described in relation to FIG. 8. Then, the processes S302 to S306 are performed to judge the quality of the electronic device 10.

In addition, although the electronic device 10 of single input and single output was described in relation to FIGS. 4 to 9, if the electronic device 10 is a device of multi-input and multi-output, the testing apparatus 100 may include, corresponding to a plurality of input and output ports, each plurality of pattern generators 102, deterministic jitter applying means 104, jitter amount controlling means 106, sinusoidal jitter applying means 110 and the judging means 108 respectively.

As obvious from the description above, according to the present invention, it is possible to test the jitter tolerance of the electronic device with high precision.

Although the present invention has been described by way of exemplary embodiments, it should be understood that those skilled in the art might make many changes and substitutions without departing from the spirit and the scope of the present invention which is defined only by the appended claims.

What is claimed is:

1. A testing apparatus for testing an electronic device, comprising:
   a deterministic jitter applying means for applying deterministic jitter to a given input signal without any amplitude variation component occurring and supplying said input signal applied with said deterministic jitter to said electronic device, wherein said deterministic jitter depends on a signal pattern of said input signal, and said input signal being a pattern signal for testing said electronic device;
   a jitter amount controlling means for controlling magnitude of said deterministic jitter to be applied by said deterministic jitter applying means; and
   a judging means for judging quality of said electronic device based on an output signal outputted by said electronic device in response to said input signal.

2. A testing apparatus as claimed in claim 1, wherein said deterministic jitter applying means comprises a first-order filter which applies said deterministic jitter as said input signal passes through said first-order filter.

3. A testing apparatus as claimed in claim 1, wherein said deterministic jitter applying means comprises a cable which applies said deterministic jitter as said input signal passes through said cable.

4. A testing apparatus as claimed in claim 1 further comprising a sinusoidal jitter applying means for applying sinusoidal jitter to said input signal.

5. A testing apparatus as claimed in claim 4, wherein said sinusoidal jitter applying means applies said sinusoidal jitter of a plurality of frequency components to said input signal.

6. A testing method for testing an electronic device, comprising:
   a deterministic jitter application step of applying deterministic jitter to a given input signal without any amplitude variation component occurring and supplying said input signal applied with said deterministic jitter to said electronic device, wherein said deterministic jitter depends on a signal pattern of said input signal, and said input signal being a pattern signal for testing said electronic device;
   a jitter amount control step of controlling magnitude of said deterministic jitter to be applied in said deterministic jitter application step; and
   a judgment step of judging quality of said electronic device based on an output signal outputted by said electronic device in response to said input signal.

7. A testing method as claimed in claim 6, wherein said deterministic jitter is applied by using a first-order filter through which said input signal passes in said deterministic jitter application step.

8. A testing method as claimed in claim 6, wherein said deterministic jitter is applied by using a cable through which said input signal passes in said deterministic jitter application step.

9. A testing method as claimed in claim 6 further comprising a sinusoidal jitter application step of applying sinusoidal jitter to said input signal.

10. A testing method as claimed in claim 9, wherein said sinusoidal jitter of a plurality of frequency components is applied in said sinusoidal jitter application step.

* * * * *